United States Patent [19]

Machida et al.

[11] Patent Number: 5,853,523
[45] Date of Patent: Dec. 29, 1998

[54] PLASMA-ETCHING ELECTRODE PLATE

[75] Inventors: Osamu Machida, Odawara; Hisayuki Hamajima, Chigasaki, both of Japan

[73] Assignee: Tokai Carbon Company, Ltd., Tokyo, Japan

[21] Appl. No.: 799,943

[22] Filed: Feb. 14, 1997

[30] Foreign Application Priority Data

Feb. 15, 1996 [JP] Japan .................................. 8-052466

[51] Int. Cl.⁶ .......................................................... C23F 1/02
[52] U.S. Cl. ....................................... 156/345; 118/723 E
[58] Field of Search ....................... 156/345; 118/723 E, 118/728; 204/298.02, 298.31

[56] References Cited

U.S. PATENT DOCUMENTS

| 5,017,274 | 5/1991 | Kerr et al. ............................... 204/129 |
| 5,074,456 | 12/1991 | Degner et al. ........................... 228/121 |
| 5,324,411 | 6/1994 | Ichishima et al. .................. 204/298.33 |

*Primary Examiner*—R. Bruce Breneman
*Assistant Examiner*—Luz Alejandro
*Attorney, Agent, or Firm*—Flynn, Thiel, Boutell & Tanis, P.C.

[57] ABSTRACT

A plasma-etching electrode plate in the form of flat glassy carbon plate is characterized by a flatness with a warp smaller than 0.3 mm. This flatness permits the electrode plate to have a uniform surface temperature distribution which contributes to uniform etching on semiconductor wafers. The electrode plate is a glassy carbon plate obtained from one or more thermosetting resins having a carbon yield higher than 20%.

7 Claims, No Drawings

PLASMA-ETCHING ELECTRODE PLATE

FIELD OF THE INVENTION

The present invention relates to an improvement in plasma-etching electrode plates used in the production, of semiconductor integrated circuits. More particularly, the present invention relates to an improvement in plasma-etching electrode plates produced from a carbonaceous material.

The plasma-etching electrode plate of the present invention is used for the etching of a silicon oxide film of on a wafer in the production of semiconductor integrated circuits. It is a glassy carbon plate useful as an electrode for a plasma etching system equipped with parallel plate electrodes of the shower type.

BACKGROUND OF THE INVENTION

The plasma etching process employs an apparatus as disclosed in U.S. Pat. No. 4,534,816, Lee Chen, "Single Wafer Plasma Etch Reactor" (issued Aug. 13, 1988), U.S. Pat. No. 4,780,159, Mark M., "Non-uniform Gas Inlet for Dry Etching Apparatus" (issued Oct. 25, 1988), U.S. Pat. No. 5,423,936, U.S. Pat. No. 5,445,709, and others.

The disclosed apparatus is provided with paired parallel plate electrodes facing each other. One of them is located at the lower part of the chamber so that wafers (substrates) are placed on it. Another of them is located at the upper part of the chamber and has a number of small through holes for gas introduction. For etching, this apparatus applies a high-frequency electric power across the electrodes to induce a discharge while introducing a reactive gas (such as halogen gas and freon gas) through the upper electrode. The resulting gas plasma attacks that part of the substrate which is not protected by a photoresist. In this way, accurate fine circuit patterns are formed on the semiconductor wafer.

The upper electrode for plasma etching is a disk having a number of small through holes as shown in Lee Chen's patent (FIG. 2) or Mark's patent (FIG. 3A). It varies in the shape, number, and arrangement of small holes depending on the apparatus and etching conditions. (In other words, not all electrodes of the same type can be used in common for any apparatus.) The shape of small holes strictly depends on the kind of the electrode for individual apparatuses.

Additional requirements for the electrode plate include good electrical conductivity, high purity (to prevent wafer contamination), and chemical stability (to protect itself from etching). To meet these requirements, early electrodes were made of aluminum, stainless steel, or carbon (graphite). Electrode plates made of glassy carbon have come into general use recently.

Glassy carbon is a hard, macroscopically non-porous carbonaceous substance obtained by carbonization of a thermosetting resin. It is characterized by a high strength, chemical inertness, gas impermeability, self-lubrication, toughness, and purity. Another advantage over other materials is that it has the least likely possibility of fine particles releasing themselves from the structure to contaminate the wafer during plasma etching.

The ever-increasing degree of integration needs plasma-etching electrodes to meet requirements for configuration as well as physical and chemical properties. In other words, the plasma-etching electrodes should be least liable to wafer contamination with particles and to wearing. Efforts have been made to improve the plasma-etching electrodes of glassy carbon.

Some examples of improvements are as follows.

(1) A glassy carbon material for the plasma apparatus which is characterized by a porosity of 0.0002–0.0020%, a crystallite undetectable by X-ray diffraction, and an impurity content lower than 5 ppm. In other words, it has improved purity, porosity, pore diameter, and crystalline structure. (Japanese Patent Laid-open No. 33007/1991)

(2) A plasma-etching electrode plate of high-purity glassy carbon having the structure characterized by a pore diameter smaller than 1 $\mu$m (maximum) or 0.7 $\mu$m (average) and a porosity lower than 1%. (EP421668B1)

(3) A plasma-etching electrode plate (thicker than 2 mm) of high-purity glassy carbon which is substantially free of grain boundaries in the surface and inner structure and has a pore diameter smaller than 1 $\mu$m (maximum). (Japanese Patent Laid-open No. 285086/1991)

(4) A plasma-etching electrode plate of glassy carbon characterized by an ash content lower than 5 ppm, metal impurities lower than 2 ppm, a total sulfur content lower than 30 ppm, a specific gravity higher than 150, a flexural strength higher than 1100 kg/cm$^2$, and a crystalline structure with a crystal interlayer distance (002) smaller than 0.375 nm and a crystallite size (002) larger than 1.3 nm. (Japanese Patent Laid-open No. 320955/1993)

(5) A plasma-etching electrode plate of glassy carbon composed of crystals having a lattice constant smaller than 6.990 Å. (Japanese Patent Laid-open No. 128761/1994)

(6) A plasma-etching electrode plate of glassy carbon having a surface roughness ($R_{max}$) lower than 6 $\mu$m at that part of the surface which is subject to wear by plasma. (Japanese Patent Laid-open No. 128762/1994)

(7) A plasma-etching electrode plate of glassy carbon made of phenolic resin and polycarbodiimide resin. (Japanese Patent Laid-open No. 347276/1993)

(8) A plasma-etching electrode plate of glassy carbon made of polycarbodiimide resin. (Japanese Patent Laid-open No. 347278/1993)

Characteristic properties required of the plasma-etching electrode plate are not limited to physical and chemical ones. The plasma-etching electrode plate should permit wafers to be etched at a certain rate. This characteristic property has become important with the increasing degree of integration of semiconductors. Accurate fabrication needs etching at a uniform rate. This means a uniform etching depth in each wafer as well as in each process. The uniformity of etch rate depends greatly on the temperature distribution on the surface of the electrode plate. Any fluctuation in surface temperature adversely affects etching at a uniform rate.

The temperature of the electrode plate sometimes reaches 150°–180° C. due to the plasma, depending on reaction conditions. An early way to keep the electrode plate at a constant temperature was by indirect cooling with a gas, as disclosed in U.S. Pat. No. 5,155,331. Gas cooling needs a complex apparatus which sometimes does not fit in the etching unit. Another way of uniform cooling is to attach a heat-radiating metal plate to each side of the electrode plate. (See U.S. Pat. No. 5,445,709 and U.S. Pat. No. 4,908,095.)

The electrode plate has become larger in diameter than before so as to handle wafers of larger diameter. This proposes a problem with the warp of the electrode plate. Warp prevents close contact between the electrode plates and the cooling metal plate and hence prevents uniform cooling. In general, warp becomes more noticeable as the thickness decreases relative to the surface area.

Warp forms a small gap between the electrode plate and the cooling metal plate, and this gap prevents heat conduction and hence prevents uniform cooling and reduces cooling efficiency. A wafer without uniform cooling undergoes uneven etching. (Etching proceeds rapidly at a hotter part.) In some cases it is possible to remove warp to some extent by finish grinding, however, in general, grinding rather promotes warp because grinding reduces the wafer's thickness and generates heat.

This problem may be solved by interposing a flexible, electrically conductive sheet between the electrode plate and the cooling metal plate. (Japanese Patent Laid-open No. 290984/1990) Using an electrically conductive sheet for close contact presents a problem with respect to resistance to plasma and corrosion if it is made of silicon rubber. Another problem is that the electrically conductive sheet releases during etching the electrically conductive material incorporated thereinto to impart conductivity. This released material generates so-called "particles" (meaning minute foreign matter). These particles will stick to the wafer surface during etching and make trouble for the integrated circuits. Close contact for efficient cooling may also be achieved by increasing the pressure on the wafer clamp ring. (U.S. Pat. No. 5,155,331) However, excessive tightening might break the carbon electrode plate which is less tough than a metal one.

SUMMARY OF THE INVENTION

In order to address the above-mentioned problem, the present inventors thoroughly investigated how the plasma-etching electrode plate of glassy carbon affects the uniformity of etch rate depending on its shape. It was found that the etch rate is uniform and stable only if the electrode plate of glassy carbon has a warp smaller than 0.3 mm which permits the cooling metal plate to come into close contact with the electrode plate to ensure the uniform surface temperature of the electrode plate. This finding led to the present invention.

It is an object of the present invention to provide a plasma-etching electrode plate of glassy carbon which has a stable, uniform surface temperature distribution to ensure a stable, uniform rate of plasma etching on semiconductor wafers over a long period of time.

The plasma-etching electrode plate of the present invention is a flat plate of glassy carbon having a warp smaller than 0.3 mm.

The electrode plate should be as flat as possible at the beginning because it warps as it becomes thinner after gradual corrosion by the etching gas.

DESCRIPTION OF THE PREFERRED EMBODIMENTS

It is necessary to follow the procedure mentioned below to produce the plasma-etching electrode plate having a minimum of warp.

The plasma-etching electrode plate of glassy carbon is produced by the steps of forming a thermosetting resin into a plate, curing the plate, heating the plate at 800°–1400° C. for carbonization in a non-oxidizing atmosphere, heating the plate (of glassy carbon) at 1400°–3000° C. in an atmosphere of a halogen, and finally polishing the plate.

According to the present invention, the plasma-etching electrode plate should be a plate of glassy carbon having a uniform structure which is obtained by baking a thermosetting resin having a carbon yield higher than 20%. (The carbon yield means the amount of carbon content (in wt. %) which remains after baking at 800°–1000° C. in a non-oxidizing atmosphere.) It should have a high purity specified by less than 5 ppm of total ash content, less than 2 ppm of metal impurities, and less than 30 ppm of total sulfur content. In addition, it should be as flat as possible.

The glassy carbon plate is usually produced from one or more than one thermosetting resin (such as phenolic resin, furan resin, and polycarbodiimide resin) having a high carbon yield by forming, heating (for curing), and baking (for carbonization) in a non-oxidizing atmosphere.

The process of curing differs from one thermosetting resin to another. In the initial stage of curing, the precondensate undergoes crosslinking, with polymerization and condensation. It is necessary to carry out the curing reaction uniformly so as to ensure uniform shrinkage and accurate dimensions.

Shrinkage may also occur in the step of baking for carbonization and conversion into the glassy structure. This shrinkage leads to an internal strain which lowers the dimensional accuracy of the glassy carbon plate, causing warp, particularly in the case of a thinner one.

The present invention is characterized in that the plasma-etching electrode plate is a flat glassy carbon plate having a warp smaller than 0.3 mm. The plasma-etching electrode plate should be as flat as possible because it is necessary to tightly attach a cooling metal plate to the back of the electrode plate. Warp prevents close contact and hence prevents uniform cooling. The electrode plate with an uneven temperature distribution prevents uniform etching and hence prevents precision fabrication.

As the electrode plate becomes thinner after exposure to the plasma, it warps more if there is an uneven temperature distribution. The resulting warp produces a gap between the electrode plate and the cooling metal plate, resulting in an uneven temperature distribution and hence an uneven etch rate. As a precaution against such a situation, it is essential to make the electrode plate as flat as possible in the beginning of manufacturing.

The flat electrode plate having a warp smaller than 0.3 mm according to the present invention permits uniform contact with the cooling metal plate and hence ensures uniform cooling and uniform temperature distribution at the time of etching, which leads to a uniform, stable etch rate.

For the electrode plate to remain flat during its use, it is necessary that the initial warp should preferably be smaller than 0.2 mm. A warp greater than 0.3 mm prevents uniform contact for the cooling metal plate and hence causes variation in surface temperature distribution and etch rate. It is only possible to cool the electrode plate uniformly for a long time by limiting the maximum warp below 0.3 mm.

The small warp as specified in the present invention is attained by the following steps.

(1) Curing

After forming from a thermosetting resin, the plate is heated (for curing) at 150°–300° C. in the atmosphere. Since the curing reaction is exothermic, it is necessary to raise the temperature slowly at a rate of 10° C./h or below, preferably 5° C./h or below, for uniform curing. The slower the temperature rises, the slower the shrinkage occurs and hence the smaller the warp is. The plate should be kept at a prescribed heating temperature for a certain period of time so that shrinkage occurs slowly. Gradual shrinking is important for the small warp. An adequate curing time should be established according to the resin composition, hardener, and curing temperature.

(2) Carbonization

After curing, the resin plate is finished by milling, grinding, and polishing to remove the surface unevenness. The finished resin plate is heated (for baking and carbonization) at 800° C. or above in a furnace with a non-oxidizing atmosphere. In this way a glassy carbon plate is obtained. Heating in this step should be uniform to minimize warp due to shrinkage. It is necessary to raise the heating temperature at a rate lower than 10° C./h, preferably lower than 5° C./h, so as to avoid internal stress.

To ensure uniform carbonization, which is important to prevent warp, the cured resin plate is held between two plates with good thermal conductivity when it is carbonized.

These plates should have a certain thickness and a smooth surface free from particles. A preferred example is a smoothly finished isotropic graphite plate thicker than 5 mm, preferably thicker than 8 mm, having a coefficient of thermal conductivity greater than 80 kcal/m·h·°C. and an elastic modulus greater than 900 kgf/mm$^2$.

The graphite plate is desirable because of its good heat conductivity and heat resistance as well as its good gas permeability. The last property produces the effect of releasing gaseous components from the resin plate during carbonization. A metal plate is not desirable because of its gas impermeability. A porous metal plate is poor in heat resistance. A sintered product of carbide or nitride is poor in thermal conductivity.

Carbonizing under adequate conditions of uniform heat conduction prevents warp effectively.

(3) Purification

After carbonization, the glassy carbon plate is purified further by heating at 1400°–3000° C. in an electric furnace through which a purified halogen gas is passed.

(4) Mirror Finishing

Finally, the purified glassy carbon plate is polished with buffing or lapping with a diamond abrasive so that the resulting plasma-etching electrode plate has an extremely smooth surface. In order to remove warp that might have occurred during purification or to minimize secondary warp due to frictional heat, it is necessary to cool the work below 20° C., preferably below 15° C., and more preferably below 10° C., during polishing. This object may be accomplished by cooling the work beforehand, by polishing the work immersed in cooling water, or by spraying the work entirely or partly with cooling water or a coolant such as liquidized carbon dioxide, liquidized ammonia, and liquidized nitrogen. It is most desirable to apply the second or third method to the previously cooled work.

The polished work should not undergo purification again because repeated heating for purification would cause additional warping.

Incidentally, small through holes for introduction of a reactive gas may be formed in the plasma-etching electrode plate during the stage of molding from a thermosetting resin or after the step of carbonization. In the first case, the hole size should be determined in anticipation of shrinkage that occurs during carbonization. In the second case, drilling may be accomplished by electro arc machining or laser machining.

Warp may be measured in the following manner. A specimen of glassy carbon plate is placed on a surface plate, and the distance from the surface plate and the thickness of the specimen are measured using a dial gauge at the center of the specimen and the periphery of the specimen which is equally divided into four to ten sections. Warp is calculated from the difference between the distance and the thickness according to the formula 1. Incidentally, the dial gauge may be replaced by an electric apparatus such as laser tracer.

EXAMPLES

The glassy carbon plate of the present invention may be produced in the following manner. The raw material is a phenolic resin, furan resin, polyimide resin, or polycarbodiimide resin, or a mixture thereof which has previously been purified so that the carbon yield is desirably higher than 20%. The raw material resin is formed into a prescribed shape by compression, extrusion, injection, centrifugal molding, or casting according to its properties (powder or liquid).

The invention will be described in more detail with reference to the following examples and comparative examples, which are not intended to restrict the scope of the invention.

Examples 1 to 5

A purified precondensate of a furan resin was used as the raw material resin. To 100 pbw of this raw material resin was added 0.6 pbw of a hardener (p-toluenesulfonic acid). The resulting raw material resin liquid was cast into a polyethylene vat, deaerated under a reduced pressure (lower than 10 Torr) for 3 hours, and allowed to stand for 24 hours in an electric oven at 80° C. Thus there was obtained a disk 250 mm in diameter.

This disk was heated (for curing) at 200° C. for 24 hours in the atmosphere. The cured disk was made 5 mm thick by milling. The resulting resin-molded disk, 250 mm in diameter and 5 mm thick, was machined by drilling (with a cemented carbide tool) to make small through holes (1.0 mm in diameter) at equal intervals of 2.5 mm. The disk was held between two flat graphite plates (G347, from Tokai Carbon Co., Ltd.) 5–15 mm thick, having a thermal conductivity of 110 kcal/m·h·°C. and an elastic modulus of 1100 kgf/mm$^2$ and containing less than 5 ppm of impurities. The assembly was baked (for carbonization) up to 1000° C. in an baking furnace through which nitrogen gas was flowing. The temperature was raised at a rate of 2° C./h.

The baked disk was transferred into an electric heating furnace capable of atmospheric adjustment. It was heated (for purification) up to 2000° C. in the furnace through which purified chlorine gas ($Cl_2$/Ar=5/95 in mol) for purification was flowing at a rate of 5 liters per minute. Subsequently, the disk was made flat by polishing with a diamond abrasive. Thus there were obtained several samples of glassy carbon plates, 200 mm in diameter and 4 mm thick, having a number of small through holes. These samples vary in the degree of warp. Their high purity is indicated by the total ash content of 2 ppm.

The glassy carbon plate was placed on a surface plate, and the distance from the surface plate and the thickness of the specimen were measured using a dial gauge at the center of the plate and the periphery of the plate which is equally divided into eight sections. Warp at each point was calculated from the difference between the distance and the thickness, and the maximum warp was obtained.

The thus prepared electrode plate of glassy carbon was mounted on the plasma etching system. Plasma etching was performed on an oxide film on a 6-inch silicon wafer under the following conditions.

Reactive gas: trichloromethane

Carrier gas: argon

Chamber pressure: 1 Torr

Power frequency: 13.5 MHz

After etching for 50 hours or 100 hours, the wafer was examined at nine points for etching depth and its variation to evaluate the etch rate and etching uniformity. The results are shown in Table 1.

Comparative Examples 1 to 3

The same procedure as in Examples 1 to 5 was repeated except that the graphite plate was replaced by the one which is 2–3 mm thick and the order of purification and polishing was reversed. There were obtained several samples of glassy carbon plates, 200 mm in diameter and 4 mm thick, having a number of small through holes and a high purity indicated by the total ash content of 2 ppm.

They were examined for warp and etch rate and etching uniformity in the same manner as in Examples 1 to 5. The results are shown in Table 1.

Comparative Example 4

The same procedure as in Examples 1 to 5 was repeated except that the graphite plate was replaced by one which was 4 mm thick and the order of purification and polishing was reversed. There was obtained several samples of glassy carbon plate, 200 mm in diameter and 4 mm thick, having a number of small through holes and a high purity indicated by the total ash content of 2 ppm.

It was examined for warp and etch rate and etching uniformity in the same manner as in Examples 1 to 5. The results are shown in Table 1.

TABLE 1

| Example (Comparative Example) | Maximum warp (mm) | Etch rate and etching uniformity | | | | | | Thickness of graphite plate (mm) |
|---|---|---|---|---|---|---|---|---|
| | | Time (h) | Rate (Å/h) | Uniformity (Å) | Time (h) | Rate (Å/h) | Uniformity (Å) | |
| 1 | 0.02 | 50 | 5070 | ±70 | 100 | 5100 | ±90 | 15 |
| 2 | 0.05 | 50 | 5070 | ±70 | 100 | 5070 | ±90 | 10 |
| 3 | 0.1 | 50 | 5050 | ±80 | 100 | 5100 | ±90 | 8 |
| 4 | 0.2 | 50 | 5030 | ±105 | 100 | 5050 | ±100 | 6 |
| 5 | 0.3 | 50 | 5000 | ±140 | 100 | 5000 | ±136 | 5 |
| (1) | 0.4 | 50 | 4900 | ±200 | 100 | 5000 | ±210 | 4 |
| (2) | 0.5 | 50 | 4800 | ±350 | 100 | 4750 | ±330 | 3 |
| (3) | 0.7 | 50 | 4700 | ±360 | 100 | 4750 | ±390 | 2 |
| (4) | 0.9 | 50 | 4700 | ±450 | 100 | 4550 | ±500 | 3 |

It is noted from Table 1 that the plasma-etching electrode plates of the present invention (which have a warp smaller than 0.3 mm) are superior to those in Comparative Examples (which have a warp larger than 0.4 mm) in etching depth and etch rate uniformity after etching for 50 hours or 100 hours. Incidentally, the results of etching for 100 hours indicated that etching proceeds faster at the central part than at the periphery of the wafer if the electrode plate of the comparative example is used.

As mentioned above, the plasma-etching electrode plate of the present invention is a flat plate of glassy carbon having a warp smaller than 0.3 mm. Therefore, it permits close contact of the cooling metal plate for uniform cooling which leads to the stable surface temperature. The uniformly cooled electrode plate ensures uniform etch rate and high yields and has a longer life. Thus the plasma-etching electrode plate produced according to the present invention is very useful for fabrication of semiconductors by plasma etching.

What is claimed is:

1. A plasma-etching electrode plate in the form of flat glassy carbon plate which is characterized by flatness with a warp smaller than 0.3 mm.

2. A plasma-etching electrode plate as defined in claim 1, which is characterized by flatness with a warp smaller than 0.2 mm.

3. A plasma-etching electrode plate as defined in claim 1, which is a glassy carbon plate obtained from at least one thermosetting resin having a carbon yield higher than 20%.

4. The plasma-etching eletrode of claim 1, wherein the electrode plate has a thickness greater than 5 mm.

5. A plasma-etching apparatus comprising an upper electrode plate and a lower electrode plate provided in face-to-face parallel relationship with respect to each other and means for applying a high-frequency electric power across the electrode plates, wherein an improvement comprises the upper electrode plate being a glassy carbon plate having a flatness with a warp less than 0.3 mm.

6. The plasma-etching apparatus of claim 5, wherein the glassy carbon plate has a flatness with a warp of less than 0.2 mm.

7. The plasma-etching apparatus of claim 6, wherein the glassy carbon plate has a thickness greater than 5 mm.

* * * * *